(12) United States Patent
Toda

(10) Patent No.: US 10,964,724 B2
(45) Date of Patent: Mar. 30, 2021

(54) DISPLAY DEVICE

(71) Applicant: Japan Display Inc., Minato-ku (JP)

(72) Inventor: Tatsuya Toda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/109,175

(22) Filed: Aug. 22, 2018

(65) Prior Publication Data

US 2019/0074298 A1 Mar. 7, 2019

(30) Foreign Application Priority Data

Sep. 5, 2017 (JP) ................................. 2017-170331

(51) Int. Cl.
| | |
|---|---|
| *H01L 27/12* | (2006.01) |
| *G09G 3/36* | (2006.01) |
| *G09G 3/3266* | (2016.01) |
| *G09G 3/3233* | (2016.01) |
| *H01L 23/532* | (2006.01) |
| *H01L 27/32* | (2006.01) |
| *G02F 1/1368* | (2006.01) |
| *G02F 1/133* | (2006.01) |
| *G02F 1/1335* | (2006.01) |

(Continued)

(52) U.S. Cl.
CPC .......... *H01L 27/124* (2013.01); *G02F 1/1368* (2013.01); *G02F 1/13306* (2013.01); *G02F 1/133512* (2013.01); *G09G 3/3233* (2013.01); *G09G 3/3266* (2013.01); *G09G 3/3677* (2013.01); *H01L 23/5329* (2013.01); *H01L 27/1222* (2013.01); *H01L 27/1251* (2013.01); *H01L 27/3272* (2013.01); *H01L 29/7869* (2013.01); *G02F 2201/123* (2013.01); *H01L 27/3262* (2013.01); *H01L 29/41733* (2013.01); *H01L 29/42384* (2013.01)

(58) Field of Classification Search
None
See application file for complete search history.

(56) References Cited

U.S. PATENT DOCUMENTS 9,490,268 B2 * 11/2016 Yamazaki ............... G06F 3/041
9,659,972 B2 *  5/2017 Kim ...................... H01L 27/124
(Continued)

FOREIGN PATENT DOCUMENTS

| JP | 2002-343976 | 11/2002 |
|---|---|---|
| JP | 2010-103141 | 5/2010 |

*Primary Examiner* — Jack S Chen
(74) *Attorney, Agent, or Firm* — Oblon, McClelland, Maier & Neustadt, L.L.P.

(57) ABSTRACT

The purpose of the present invention is to avoid an inflection point in Vg-Id characteristics of the Thin Film transistor, and to avoid step disconnection of the insulating film formed on the semiconductor layer in the display device. The concrete structure of the present invention is: a display device including a TFT substrate having a thin film transistor (TFT) comprising; the TFT having a channel width and a channel length, a gate insulating film formed on a gate electrode, a semiconductor layer formed on the gate insulating film, wherein the gate electrode, near its edge, has a first sloping surface having a first taper angle in a cross sectional view along the direction of the channel width, an edge of the semiconductor layer in the cross sectional view along the direction of the channel width lies on the first sloping surface of the gate electrode.

10 Claims, 15 Drawing Sheets

(51) Int. Cl.
  *H01L 29/786* (2006.01)
  *H01L 29/423* (2006.01)
  *H01L 29/417* (2006.01)

(56) References Cited

U.S. PATENT DOCUMENTS

2016/0351724 A1* 12/2016 Zhao ................. H01L 29/10
2017/0219887 A1* 8/2017 Deng ................ G02F 1/133707

* cited by examiner

DISPLAY DEVICE

CLAIM OF PRIORITY

The present application claims priority from Japanese Patent Application JP 2017-170331 filed on Sep. 5, 2017, the content of which is hereby incorporated by reference into this application.

BACKGROUND OF THE INVENTION

(1) Field of the Invention

The present invention relates to the liquid crystal display device or the organic EL display device, wherein characteristics of TFTs for the switching element in the pixel or for the driving circuit are improved.

(2) Description of the Related Art

A liquid crystal display device has a TFT substrate, a counter substrate opposing to the TFT substrate, and a liquid crystal layer sandwiched between the TFT substrate and the counter substrate. The TFT substrate has plural pixels arranged in matrix; each of the pixels has a pixel electrode and a thin film transistor (TFT). A transmittance of light in each of the pixels is controlled by liquid crystal molecules; thus, images are formed.

The organic EL display device has plural pixels arranged in matrix on the TFT substrate; each of the pixels has an emitting element and a driving TFT; and they are protected by a protective film. Both the liquid crystal display device and the organic EL display device are thin and light, thus, their application ranges are expanding. In both of the liquid crystal display device and the organic EL display device, the models, in which driving circuits constituted by the TFTs are built in at the periphery of the display area, are increasing.

One of the important characteristics of the TFT is a high ON current. One method to increase ON current is to widen the channel width; however, according to the resolution of the screen increases, the area that can be occupied by the TFTs is to be limited. The patent document 1 (Japanese patent application laid open No. 2010-103141) discloses that the channel of the TFT is formed on the projection as well as its inclining side wall; thus, the width of the channel is increased.

In general, the TFT is set ON and current flows when the gate voltage reaches a certain voltage (a threshold voltage). The threshold voltage is influenced by impurities in the channel of the TFT and so on. One reason of variation in threshold voltage is that: The side wall of the semiconductor layer, which constitutes the channel, has a taper, namely, a thickness of the semiconductor layer becomes gradually thin to the edge at both sides of the semiconductor layer; consequently, the influence of the impurity becomes different at the center and at the both sides of the semiconductor layer. The patent document 2 (Japanese patent application laid open No. 2002-343976) discloses to change the doping amount of the impurities between at the center and at the sides of the semiconductor layer so that the threshold voltage becomes the same between at the center and at the sides of the channel.

SUMMARY OF THE INVENTION

In the TFT, the influence of the impurities is different between at the center and at the both sides of the channel. The reason is that: the influence of the impurities to the semiconductor layer that constitutes the channel is bigger at the surface of the semiconductor layer. A thickness of the semiconductor layer decreases because of tapered shape at both sides. As a result, the influence of the impurities is bigger at the both sides of the channel.

If the influence of the impurities is different, the threshold voltage becomes different between at the center of the channel and at the both sides of the channel. FIG. 6 is a graph of the characteristics of the TFT, which shows this phenomenon. The solid line of FIG. 6 is the case that the taper angle θ is 10 degrees, in which the threshold voltage is low as V2. In the meantime, the current that flows at the center and its vicinity is controlled by the higher threshold voltage V1.

When the voltage reaches some value or more, the current that flows at the center of the channel becomes major; thus, the Vg-Id characteristics has an inflection point as denoted by Q (it is called a bump in general) in FIG. 6. The existence of the inflection point Q causes a variation in the characteristics of the TFT.

The purpose of the present invention is to realize the TFT that the inflection point Q in Vg-Id characteristics does not exist or the influence of the inflection point Q is diminished; at the same time, to keep the step coverage of the insulating film that covers the semiconductor layer in a good condition; and thus, to realize the display device having high reliability and high display quality.

The present invention overcomes the above explained problem; the concrete structures are as follows.

(1) A display device including a TFT substrate having a thin film transistor (TFT) comprising: the TFT having a channel width and a channel length, a gate insulating film formed on a gate electrode, a semiconductor layer formed on the gate insulating film, wherein the gate electrode, near its edge, has a first sloping surface having a first taper angle in a cross sectional view along the direction of the channel width, an edge of the semiconductor layer in the cross sectional view along the direction of the channel width lies on the first sloping surface of the gate electrode.

(2) A display device including a TFT substrate having a thin film transistor (TFT) comprising: the TFT having a channel width and a channel length, a first insulating film formed on a light shielding film, a semiconductor layer formed on the first insulating film, a gate insulating film formed on the semiconductor layer, and a gate electrode formed on the gate insulating film; wherein the light shielding film, near its edge, has a first sloping surface having a first taper angle in a cross sectional view along the direction of the channel width, an edge of the semiconductor layer in the cross sectional view along the direction of the channel width lies on the first sloping surface of the gate electrode.

DETAILED DESCRIPTION OF THE PREFERRED EMBODIMENTS

The present invention will be described in detail referring to the following embodiments. In the explanation below, the invention is mainly explained in an example of the liquid crystal display device; however, the present invention is applicable to the organic EL display device and other display devices, too.

Embodiment 1

Figure 1:
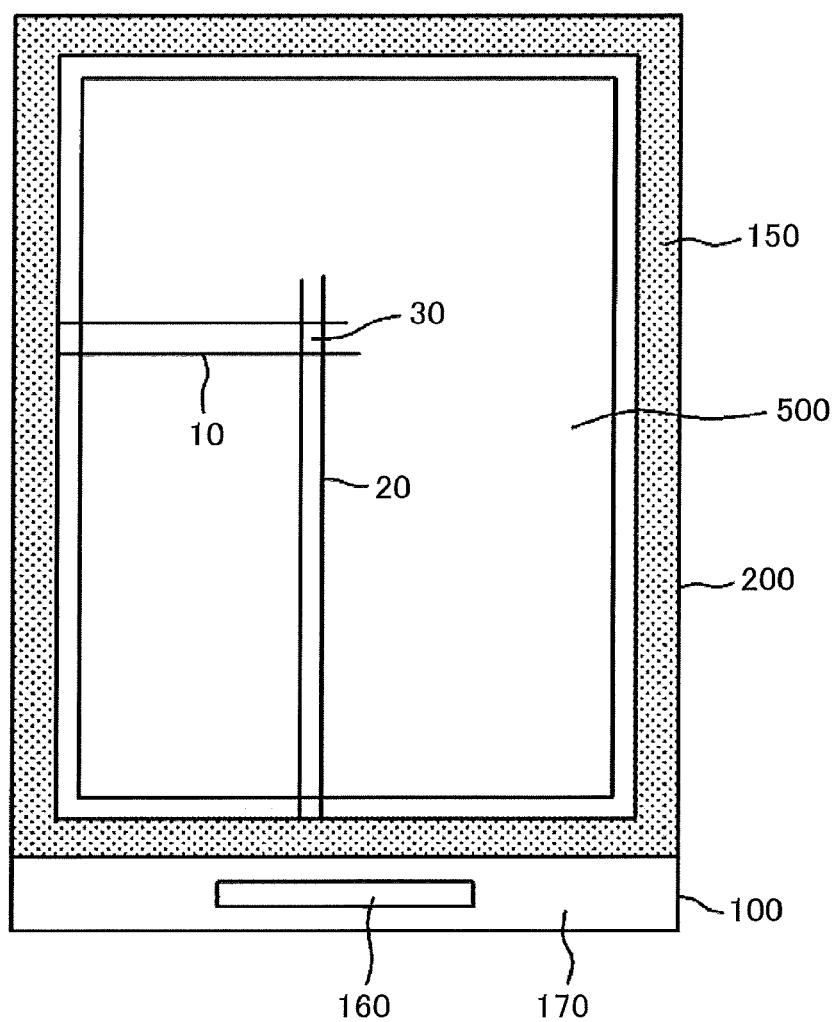
FIG. 1 is a plan view of the liquid crystal display device.

FIG. 1 is a plan view of a liquid crystal display device, which the present invention is applied. In FIG. 1, the TFT substrate 100 and the counter substrate 200 adhere to each other at their periphery by the sealing material 150; the liquid crystal is sandwiched between the TFT substrate 100 and the counter substrate 200. The TFT substrate 100 is made bigger than the counter substrate 200; the area of the TFT substrate 100 where the counter substrate 200 does not overlap is the terminal area 170. The driver IC 160 for driving the liquid crystal display panel is installed on the terminal area 170. The terminal area 170 has terminals to connect with the flexible wiring circuit substrate, which supplies powers, video signals and scanning signals to the liquid crystal display panel. In this specification, generally the liquid crystal display device means to include the liquid crystal display panel and the back light; however, terms of the liquid crystal display device and the liquid crystal display panel may be used indistinguishably.

In FIG. 1, in the display area 500, the scanning lines 10 extend in the lateral direction and are arranged in the longitudinal direction. The video signal lines 20 extend in the longitudinal direction and are arranged in the lateral direction. The pixel 30 is formed in the area surrounded by the scanning lines 10 and the video signal lines 20. The pixel electrode and the TFT are formed in each of the pixels 30. In a high definition screen, the pitch of the pixels in the direction the scanning line 10 extends is as small as 30 μm. The back light is disposed at the rear of the TFT substrate 100.

In FIG. 1, the scanning line driving circuits are formed at both sides of the display area 500. The scanning line driving circuits are constituted by TFTs. Since TFTs are used in the pixel area and in the driving circuit, the stability of the characteristics of the TFT has a great influence to the images.

Figure 2:
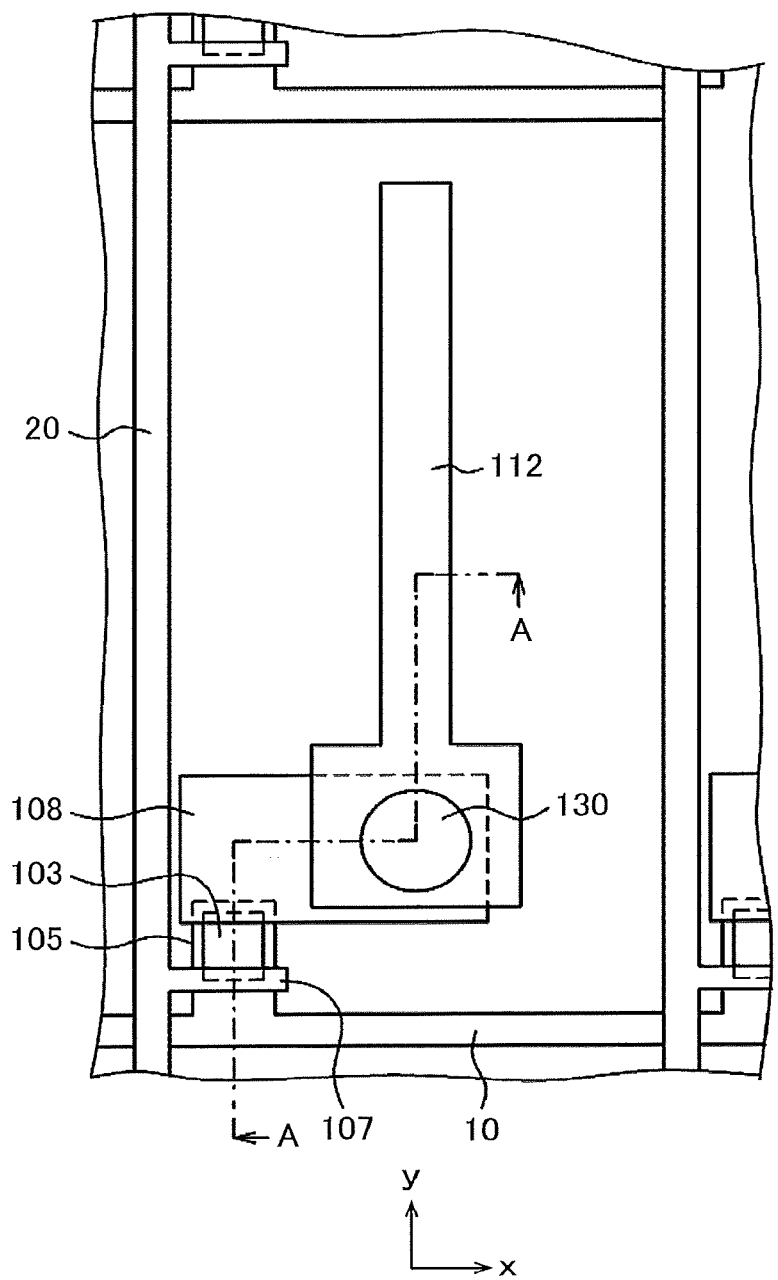
FIG. 2 is a plan view of the pixel in the display area of the liquid crystal display device.

FIG. 2 is a plan view of the pixel. In FIG. 2, x direction is the lateral direction and the y direction is the longitudinal direction. FIG. 2 is an example of the IPS (In Plane Switching) type liquid crystal display device. In FIG. 2, the scanning lines 10 extend in the lateral direction and are arranged in the longitudinal direction. The video signal lines 20 extend in the longitudinal direction and are arranged in the lateral direction. The pixel electrode 112 and the TFT are formed in the area surrounded by the scanning lines 10 and the video signal lines 20.

The TFT in FIG. 2 is a bottom gate type TFT. The present invention, however, can be applied to the TFT of a top gate type as will be explained later. In FIG. 2, the drain electrode 107 is laminated at one side of the semiconductor layer 103, which is active layer of the TFT; the source electrode 108 is laminated at another side of the semiconductor layer 103. In FIG. 2, the scanning line 10 has a branch to form the gate electrode 105 of the TFT; the video signal line 20 has a branch to form the drain electrode 107.

The source electrode 108 extends toward the center of the pixel in the x direction to connect with the pixel electrode 112 via through hole 130. The pixel electrode 112 is stripe shaped. In FIG. 2, since the lateral width of the pixel is as small as 30 μm, the pixel electrode 112 is stripe shaped; however, when the lateral width of the pixel is bigger, the pixel electrode 112 tends to be comb shaped having a slit inside.

Figure 3:
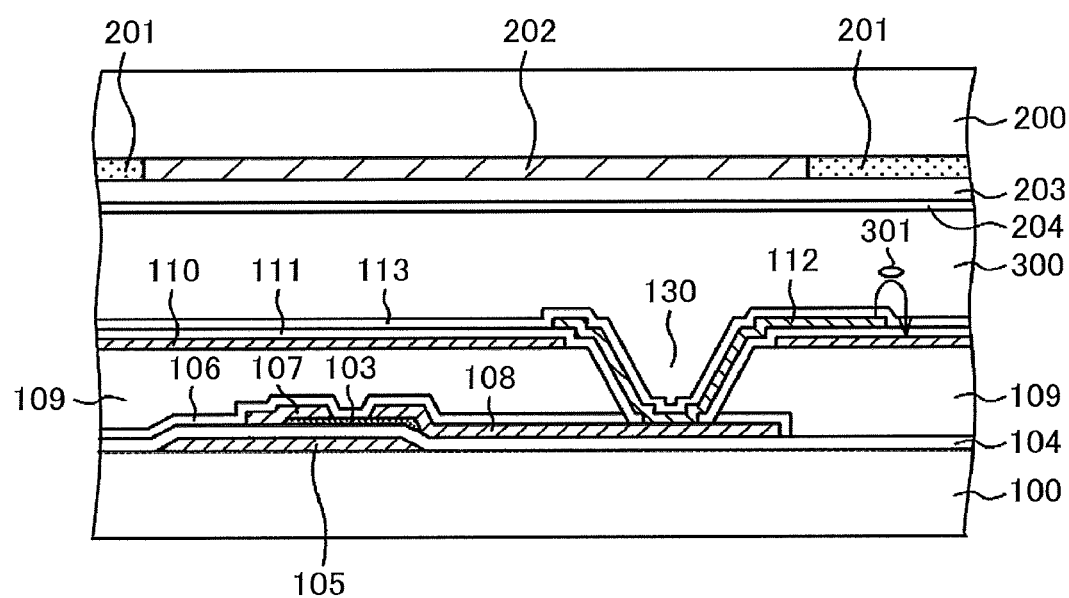
FIG. 3 is a cross sectional view of FIG. 2 along the line A-A.

FIG. 3 is a cross sectional view of the liquid crystal display device, which corresponds to the cross sectional view of FIG. 2 along the line A-A. In FIG. 3, the gate electrode 105 is formed on the TFT substrate 100, which is formed by e.g. glass. The gate electrode 105 is a branch of the scanning line 10. The gate insulating film 104 is formed to cover the gate electrode 105. The semiconductor layer 103 is formed on the gate insulating film 104 and above the gate electrode 105. As depicted in FIG. 3, the tapering is formed at the edge of the gate electrode 105 when it is patterned. As will be explained later, the edge of the semiconductor layer 103 is located at the tapered portion of the gate electrode 105.

The drain electrode 107 is laminated on one side of the semiconductor layer 103. The drain electrode 107 is a branch of the video signal line 20. The source electrode 108 is laminated on another side of the semiconductor layer 103. The channel region is formed between the drain electrode 107 and the source electrode 108. The source electrode 108 extends to right and connects with the pixel electrode 112 at the through hole 130.

The interlayer insulating film 106 is formed by e.g. silicon oxide (herein after SiO) covering the semiconductor layer 103, the drain electrode 107 and the source electrode 108 to protect the TFT. The organic passivation film 109 is formed to cover the interlayer insulating film 106. The organic passivation film 109 is formed by photo sensitive resin as e.g. acrylic. Since the organic passivation film 109 has also a role of a flattening film, it is formed as thick as approximately 2 to 4 µm. The common electrode 110 is formed in a plane shape on the organic passivation film 109.

The capacitive insulating film 111 is formed by e.g. silicon nitride (herein after SiN) to cover the common electrode 110. The pixel electrode 112 is formed on the capacitive insulating film 111. A capacitance is formed between the pixel electrode 112 and the common electrode 110 through the capacitive insulating film 111. The pixel electrode 112 is stripe shaped as depicted in FIG. 2.

The through hole 130 is formed in the organic passivation film 109 to connect the source electrode 108 and the pixel electrode 112 of the TFT; and further, a through hole is formed in the capacitive insulating film 111 in the through hole 130 to connect the source electrode 108 and the pixel electrode 112.

The alignment film 113, which is for an initial alignment of the liquid crystal, is formed to cover the pixel electrode 112 and the capacitive insulating film 111. The alignment treatment for the alignment film 113 may be executed by either rubbing method or photo alignment method using polarized ultra violet ray. When a voltage is applied to the pixel electrode 112, the line of force as depicted in FIG. 3 is generated to rotate the liquid crystal molecules 301; thus, a transmittance of light from the back light is controlled in each of the pixels, as a result, the images are displayed.

In FIG. 3, the counter substrate 200 is disposed above the TFT substrate 100 sandwiching the liquid crystal layer 300. Inside of the counter substrate 200, the color filter 201 is formed in each of the pixel to enable color display. The black matrix 202 is formed between the color filters 201 to improve contrast of the pictures. The overcoat layer 203 is formed covering the color filter 201 and the black matrix 202. The main role of the overcoat layer 203 is to prevent the liquid crystal layer 300 from being contaminated by the pigments of the color filters 201. The alignment film 204 is formed to cover the overcoat layer 203 for the initial alignment of the liquid crystal molecules 301. The alignment treatment for the alignment film 204, too, may be executed by either rubbing method or photo alignment method using polarized ultra violet ray.

Figure 4:
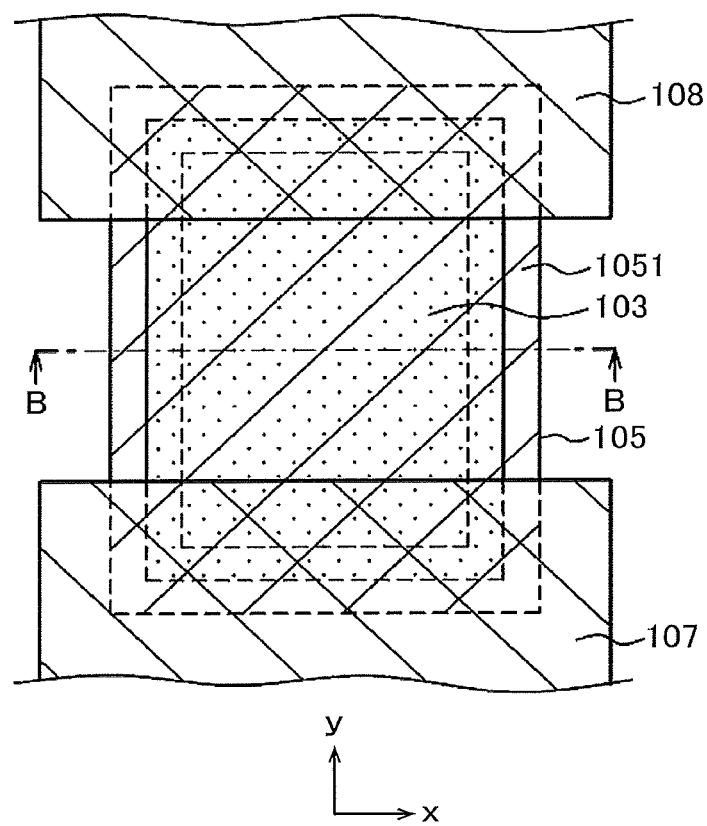
FIG. 4 is a plan view of the TFT in FIG. 2.

FIG. 4 is an enlarged plan view of the TFT in FIG. 2. In FIG. 4, the semiconductor layer 103 is formed over the gate electrode 105. The drain electrode 107, which is a branch from the video signal line 20, is laminated on the semiconductor layer 103 at one side; The source electrode 108, which is to be connected with the pixel electrode 112, is laminated on the semiconductor layer 103 at another side.

Even it is not specifically described in FIG. 4, when the semiconductor layer 103 is formed by the a-Si and the like, n+ layer is formed between the drain electrode 107 and the semiconductor layer 103 or between the source electrode 108 and the semiconductor layer 103 to have an Ohmic contact between them. The semiconductor layer 103 is made slightly smaller than the gate electrode 105 in a plan view.

In FIG. 4, the semiconductor layer 103 between the drain electrode 107 and the source electrode 108 is the channel portion. Namely, the ON current flows in y direction in FIG. 4. In FIG. 4, the periphery of the gate electrode 105 is tapered shaped: the edge of the semiconductor layer 103 is on the tapered portion 1051 of the gate electrode 105 through the gate insulating film 104 in a plan view.

In FIG. 4, the patterning of the drain electrode 107 and the source electrode 108 are made through dry etching under the chloride base gas. At this time, the surface of the semiconductor layer 103 is contaminated by the gas for the dry etching or gets damages by ions; consequently, characteristics of the semiconductor layer 103 tend to deviate from the original characteristics.

Figure 5:
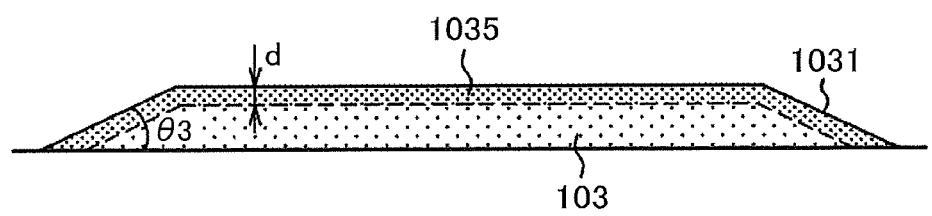
FIG. 5 is a cross sectional view of the TFT along the line B-B of FIG. 4.

FIG. 5 is a cross sectional view of the semiconductor layer 103 that shows this phenomenon. FIG. 5 is a cross sectional view of the semiconductor layer 103 corresponds to the cross sectional view of FIG. 4 along the line B-B. The semiconductor layer 103 is generally patterned by wet etching. The taper angle θ3 of the tapered portion 1031 at both sides of the semiconductor layer 103 can be controlled by a condition of etching.

In FIG. 5, the surface layer 1035 of the semiconductor layer 103 is a portion that is contaminated or got damages (herein after contaminated layer) during the drain electrode 107 and the source electrode 108 are patterned by dry etching. The contaminated layer 1035 exists from the surface to the depth d of the semiconductor layer 103.

The actual characteristics of the semiconductor layer 103 are a combination of the characteristics of the original semiconductor layer 103 and the characteristics of the contaminated layer 1035. The problem is that the combined characteristics of the semiconductor layer 103 are different between at the center and at the both sides of the semiconductor layer 103. Namely, at the both sides of the semiconductor layer 103 in FIG. 5, the ratio of the contaminated layer 1035 is bigger than at the central position of the semiconductor layer 103; therefore, threshold voltage becomes lower at the both sides of the semiconductor layer 103.

In FIG. 5, if the taper angle θ3 is 90 degrees, there is no difference in characteristics between at the center and at the sides in the semiconductor layer 103. According to the taper angle θ3 becomes smaller, the difference in characteristics of the semiconductor layer 103 between at the center and at the both sides becomes bigger.

Figure 6:
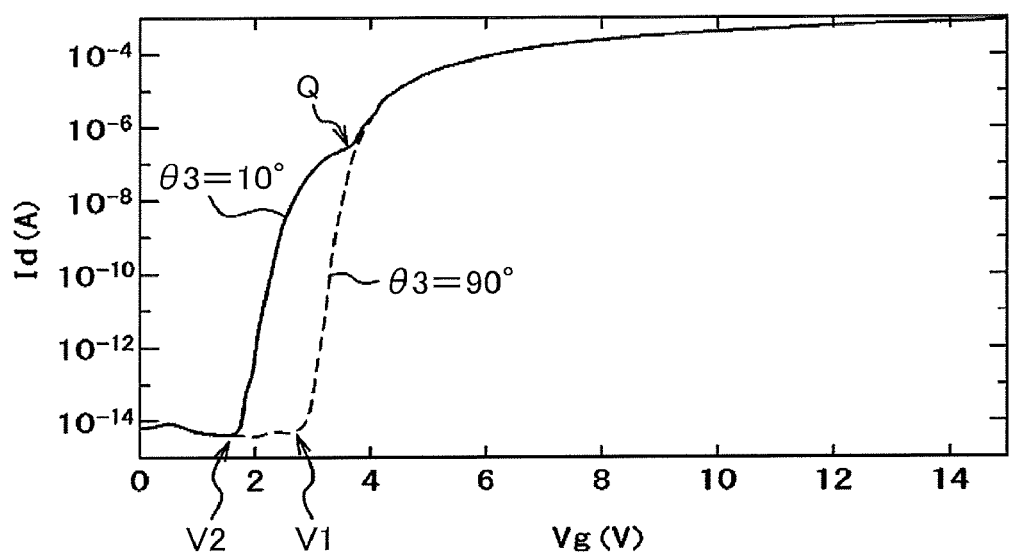
FIG. 6 is a graph of the relations between the gate voltage (Vg) and the drain current (Id) of the TFT when the inflection point exists and the inflection point does not exist.

FIG. 6 is a graph that shows the relation of the gate voltage Vg and the drain current Id when the taper angle θ3 of the semiconductor layer 103 in FIG. 5 is 10 degrees and 90 degrees. When the taper angle θ3 is small, it is conceived that there exists the TFT formed by the semiconductor layer 103 at the center and the TFT formed by the tapered portion 1031 of the semiconductor layer 103 at the both sides. Therefore, there exist two TFTs having a different threshold voltage. The solid line in FIG. 6 is when the taper angle θ3 is 10 degrees. In this case, the inflection point as denoted by Q in FIG. 6 appears.

On the other hand, when the taper angle θ3 of the semiconductor layer in FIG. 5 is 90 degrees, the inflection point Q does not appear as depicted by the broken line in FIG. 6. It is because the characteristics of the semiconductor layer 103 don't change between at the center and at the both sides of the semiconductor layer 103. The inflection point Q in FIG. 6 is caused by the taper angle θ3; therefore, according to the taper angle θ3 bigger, the inflection point Q becomes less conspicuous.

Figure 7:
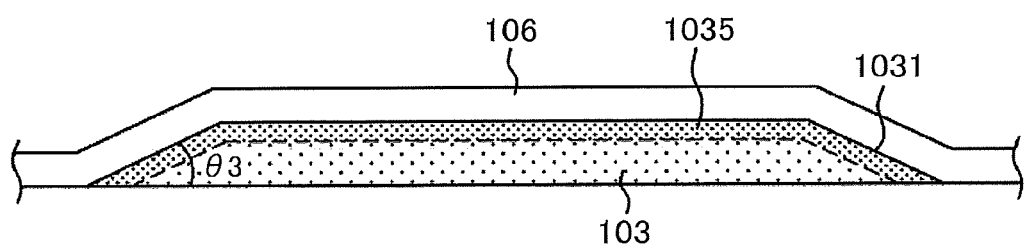
FIG. 7 is a cross sectional view of the semiconductor layer and the gate insulating film along the line B-B of FIG. 4.
Figure 8:
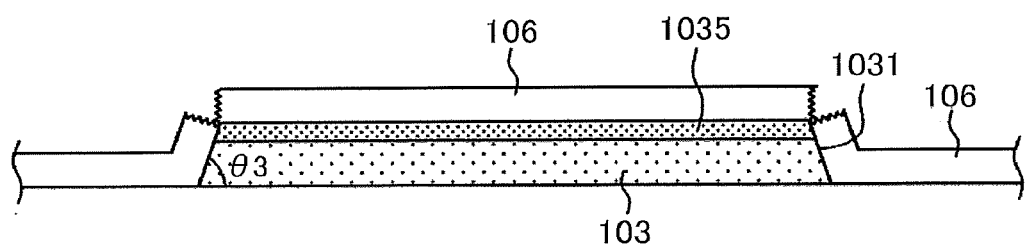
FIG. 8 is a cross sectional view of FIG. 4 along the line B-B when the step disconnection occurs in the insulating film formed on the semiconductor layer.

By the way, the semiconductor layer 103 is covered with, for example, the interlayer insulating film 106 formed by SiO as depicted in FIG. 7. Since the taper angle θ3 of the semiconductor layer 103 is small in FIG. 7, the problem of step coverage in the interlayer insulating film 106 does not appear. However, as depicted in FIG. 8, the taper angle θ3 of the semiconductor layer 103 becomes bigger, the interlayer insulating film 106, which covers the semiconductor layer 103, gets a step disconnection at the edge of the semiconductor layer 103. Consequently, the protection of the semiconductor layer 103 becomes not enough, thus, the characteristics of the TFT becomes unstable.

Therefore, there arises a dilemma that: if the taper angle θ3 of the semiconductor layer 103 is made bigger to avoid the inflection point Q, the step coverage of the interlayer insulating film 106, which covers the semiconductor layer 103, becomes not enough; thus, the reliability of the TFT is deteriorated.

Figure 9:
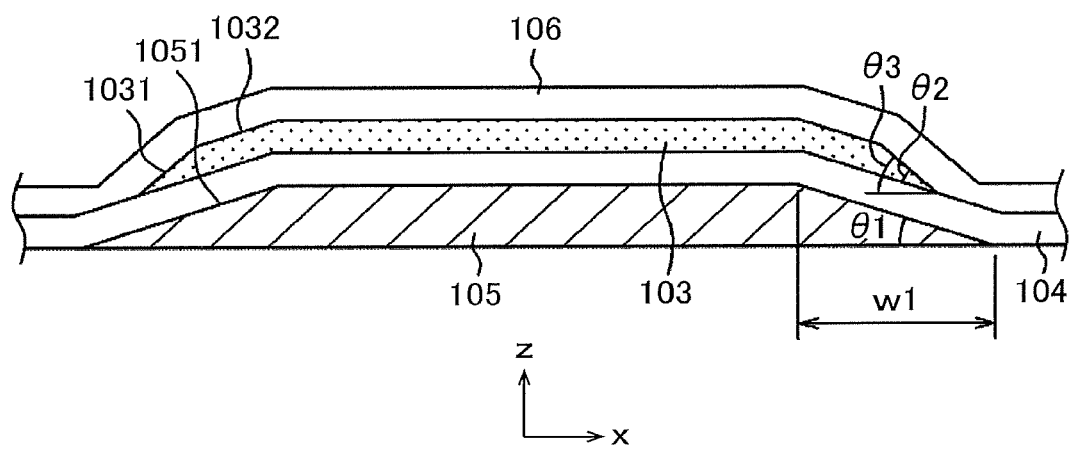
FIG. 9 is a cross sectional view of FIG. 4 along the line B-B according to the present invention.

The present invention solves this dilemma. FIG. 9 is a cross sectional view of the structure of the present invention. FIG. 9 is a cross sectional view of FIG. 4 along the line B-B. In FIG. 9, the gate insulating film 104 is formed on the gate electrode 105. The edge of the gate electrode 105 is a tapered portion 1051 having a taper angle of θ1. The thickness of the gate electrode 105 is e.g. 600 nm. The thickness of the gate insulating film 104 is e.g. 300 nm. Since the thickness of the gate insulating film 104 is thinner than that of the gate electrode 105, the surface shape of the gate insulating film 104 is approximately the same as the surface shape of the gate electrode 105.

In FIG. 9, the semiconductor layer 103 is formed on the gate insulating film 104. Since the thickness of the semiconductor layer 103 is e.g. 150 nm, the surface shape of the semiconductor layer 103 is approximately the same as the surface shape of the gate electrode 105. In other words, the semiconductor layer 103, too, bends along the slope 1051 of the gate electrode 105. The interlayer insulating film 106 is formed on the semiconductor layer 103.

In FIG. 9, the taper angle θ2 is generated when the semiconductor layer 103 is patterned. This taper angle θ2 is confined in a range that the step disconnection is not generated in the interlayer insulating film 106 that covers the semiconductor layer 103. The feature of FIG. 9 is to set the edge of the semiconductor layer 103 on the slope 1051 of the gate electrode 105.

The angle θ3, which is an angle between the tapered portion 1031 of the semiconductor layer 103 and the horizontal surface, namely, the x axis direction, is a summation of the taper angle θ1 of the gate electrode 105 and the taper angle θ2, which is generated when the semiconductor layer 103 is patterned. That is to say, since the taper angle θ3, which is an angle between the tapered portion 1031 of the semiconductor layer 103 and the x axis, becomes bigger, the influence of the inflection point Q is mitigated. On the other hand, the step disconnection of the interlayer insulating film 106, which covers the semiconductor layer 103, is determined by the taper angle θ2, which is generated when the semiconductor layer 103 is patterned; thus, the problem of the step coverage in the interlayer insulating film 106 is solved at the same time.

As depicted in FIG. 9, at the vicinity of the semiconductor layer 103, there exist a second slope 1032, which is the same taper angle as the tapered portion 1051 of the gate electrode 105, and a third slope having a taper angle θ3, which is a summation of the first taper angle θ1 and the original taper angle θ2 of the edge of the semiconductor layer 103 when it is patterned. In other words, the variation of the threshold voltage is determined by the third taper angle θ3; the problem of the step coverage is determined by the second taper angle θ2.

Figure 10:
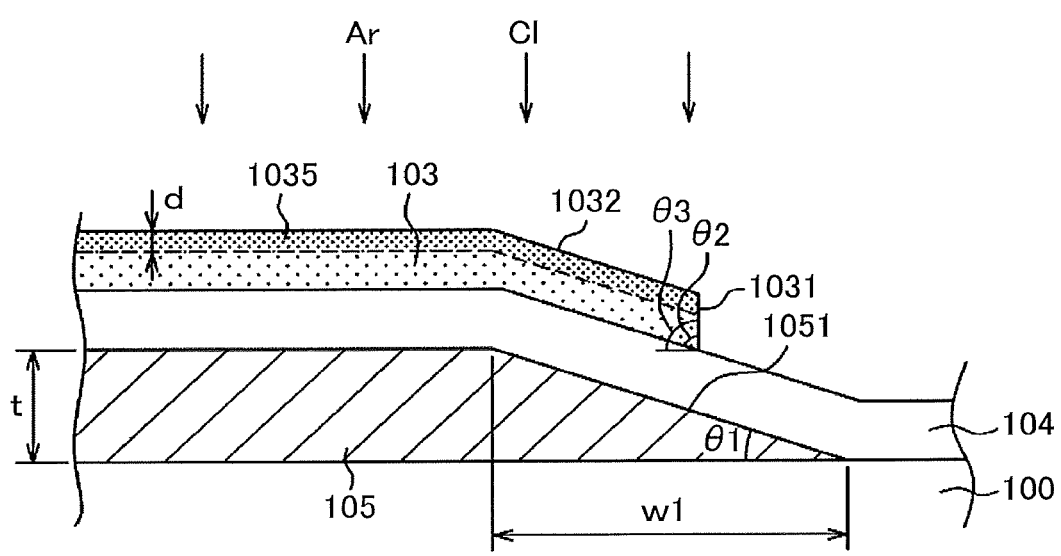
FIG. 10 is a cross sectional view of FIG. 4 along the line B-B according to another example of the present invention.

FIG. 10 is a cross sectional view of the present invention in that: the third taper angle θ3 is made 90 degrees, which is a summation of the taper angle θ1 of the gate electrode 105 and the second slope (taper angle θ2), formed when the semiconductor layer 103 is patterned. FIG. 10 is a cross sectional view that the drain electrode 107 and the source electrode 108 depicted in FIG. 4 are being patterned by dry etching. The Chloride base gas and Argon are used in the dry etching. In FIG. 10, the arrow Ar denotes the travelling direction of Ar atoms while the arrow Cl denotes the travelling direction of Chloride atoms. During the dry etching, the surface of the semiconductor layer 103 is contaminated in a depth of d by the gasses for the dry etching as denoted by 1035.

In FIG. 10, the taper angle θ3 of the third slope 1031 at the edge of the semiconductor layer 103 is 90 degrees, thus, the contaminated layer 1035 is uniform all over the semiconductor layer 103; consequently, the inflection point Q shown in FIG. 6 does not appear. On the other hand, the taper angle of the semiconductor layer 103 is θ2, which is smaller than 90 degrees by an angle θ1; therefore, the step disconnection is avoided in the interlayer insulating film 106, which covers the semiconductor layer 103.

In the present invention, as depicted in FIG. 10, the edge of the semiconductor layer 103 needs to be set in the region of the slope surface 1051 of the gate electrode 105. The width w1 where the slope is formed in the gate electrode 105 is expressed as w1=t/tan θ1, provided the thickness of the gate electrode 105 is t. Given the thickness t of the gate electrode 105 is 600 nm and θ1 is 20 degrees, w1 is 1648 nm. Since the mask alignment accuracy in the photolithography is around 1 μm, the mask alignment between the gate electrode 105 and the semiconductor layer 103 is possible.

Figure 11:
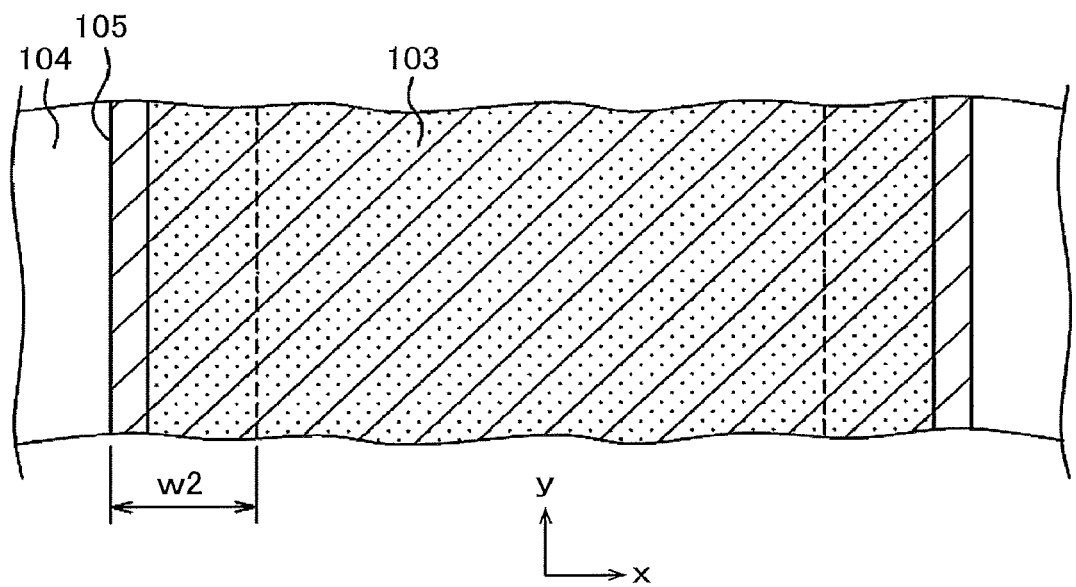
FIG. 11 is a cross sectional view of FIG. 4 along the line B-B according to yet another example of the present invention.
Figure 11:
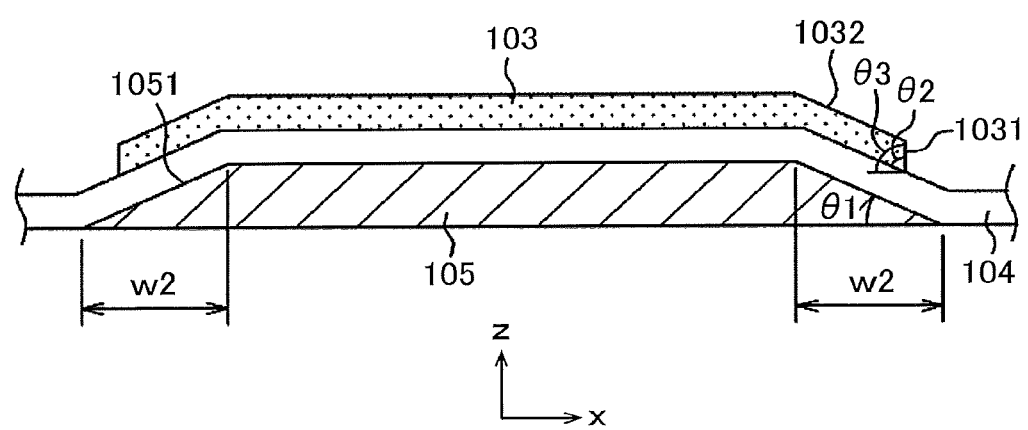

FIG. 11 is an example that the taper angle θ1 of the gate electrode 105 becomes bigger than that of FIG. 10. In this case, the taper angle θ2 of the semiconductor layer 103 itself can be made smaller to make the angle θ3 of the first slope 1031 of the semiconductor layer 103 90 degrees with respect to the x axis. Therefore, the danger of the step disconnection of the interlayer insulating film 106 that is formed on the semiconductor layer 103 is diminished. However, the mask alignment accuracy between the gate electrode 105 and the semiconductor layer 103 becomes severer because the width w2 of the slope portion 1051 at the edge of the gate electrode 105 becomes smaller.

Figure 12:
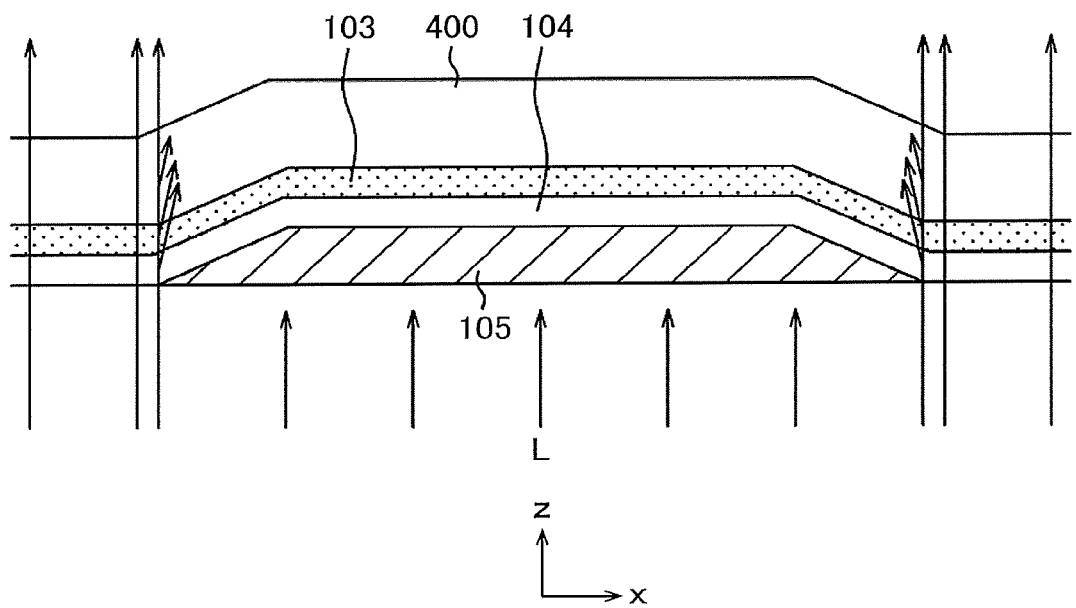
FIG. 12 is a cross sectional view of an interim structure in a manufacturing process.
Figure 13:
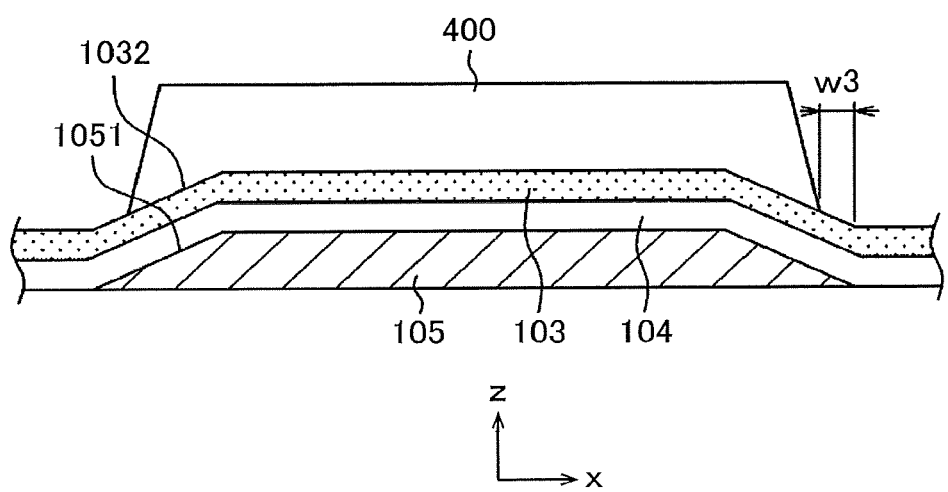
FIG. 13 is a cross sectional view of an interim structure in a manufacturing process following FIG. 12.

FIGS. 12 and 13 are examples of processes to countermeasure this problem. In FIG. 12, the gate insulating film 104 is formed after the gate electrode 105 is patterned; then, the semiconductor layer 103 is formed on the gate insulating film 104. The resist 400 for the photolithography is coated over the semiconductor layer 103. In FIG. 12, the normal photo mask is not used for the exposure of the resist 400; however, the resist 400 is exposed from the back using the gate electrode 105 as the photo mask. In FIG. 12, L means a light for exposure. In this case, the light for exposure reaches slightly inside from the edge of the gate electrode 105 by dispersion. That is to say, the resist is exposed up to slightly inside from the edge of the gate electrode 105. In the meantime, the resist 400 in this process is positive type.

FIG. 13 is a cross sectional view that the resist 400 is developed after the exposure shown in FIG. 12. As depicted in FIG. 13, the edge of the resist 400 is located inside by a distance w3 from the edge of the gate electrode 105. When the semiconductor layer 103 is etched in this state, the edge of the semiconductor layer 103 is to exist on the slope 1051 of the gate electrode 105 and is slightly inside of the edge of the gate electrode 105.

As described above, even the taper angle θ1 of the gate electrode 105 is relatively big, the edge of the semiconductor layer 103 can be set on the slope 1051 of the gate electrode 105. The taper angle θ1 of the slope 1051 of the gate electrode 105 is e.g. 10 degrees to 60 degrees; preferably, 15 degrees to 40 degrees.

Figure 14:
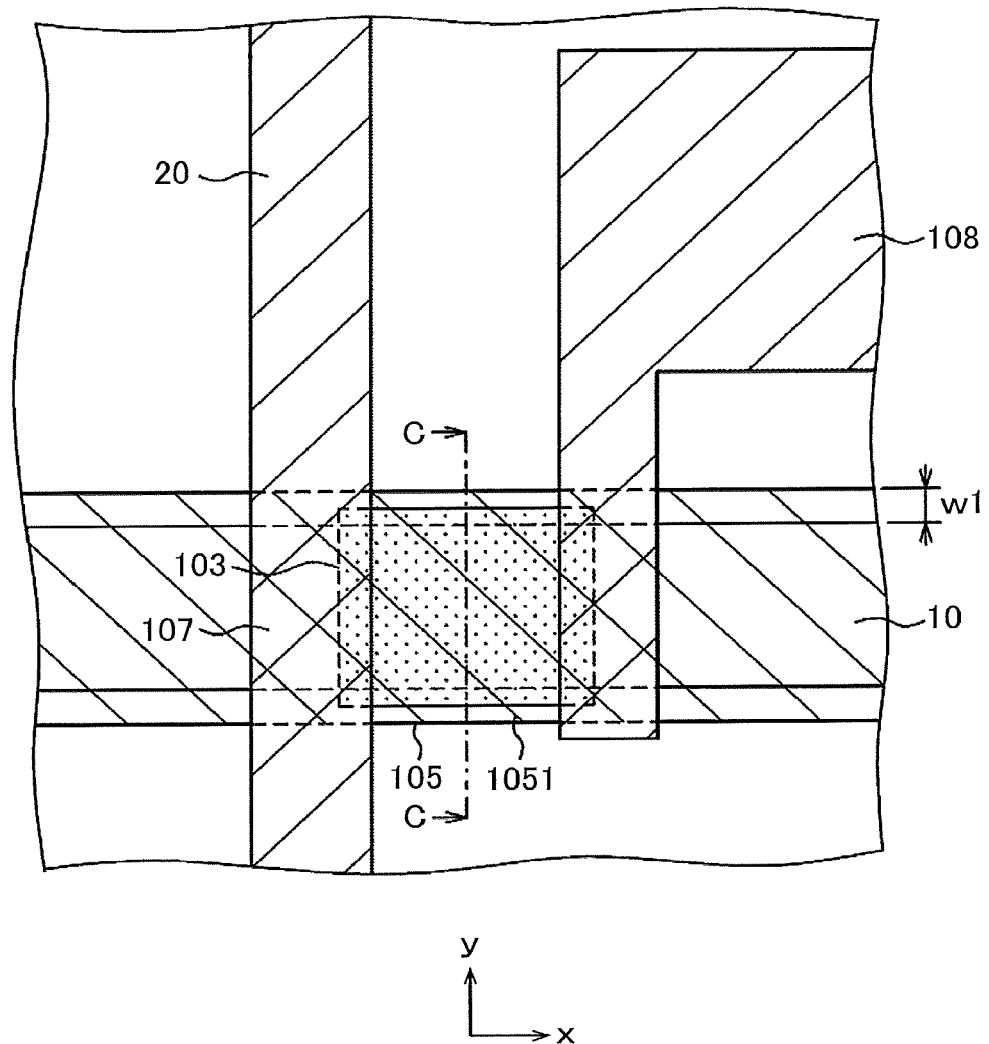
FIG. 14 is a plan view of another example of the present invention.

FIG. 14 is a plan view of an example that the position of the TFT substrate 100 in the pixel is differentiated from that of FIG. 2. In FIG. 14, the video signal lines 20 extend in the longitudinal direction (y direction); the scanning lines 10 extend in the lateral direction (x direction). The TFT is formed near the cross point of the video signal line 20 and the scanning line 10.

In FIG. 14, the video signal line 20 works as the drain electrode 107. The source electrode 108 is laminated on the semiconductor layer 103 as opposing to the drain electrode 107 in a plan view. The channel portion is formed between the drain electrode 107 and the source electrode 108. The scanning line 10 works as the gate electrode 105. The semiconductor layer 103, which is formed island like, is formed on the scanning line 10 through the gate insulating film 104.

A taper 1051 is formed at the edge of the scanning line 10 in a width of w1; the edge of the semiconductor layer 103 is on the tapered portion 1051 of the gate electrode 105 in a plan view. Therefore, a taper is formed in the semiconductor layer 103 in a same angle of the taper 1051 of the gate electrode 105 near the edge of the semiconductor layer 103 in FIG. 14. In other words, the cross sectional view of FIG. 14 along the line C-C is the same as FIGS. 9 and 10. Thus, the inflection point Q of the ON current of the TFT is eliminated or the influence of the inflection point Q is decreased, and the step disconnection of the insulating film 106 formed on the semiconductor layer 103 can be avoided.

Figure 15:
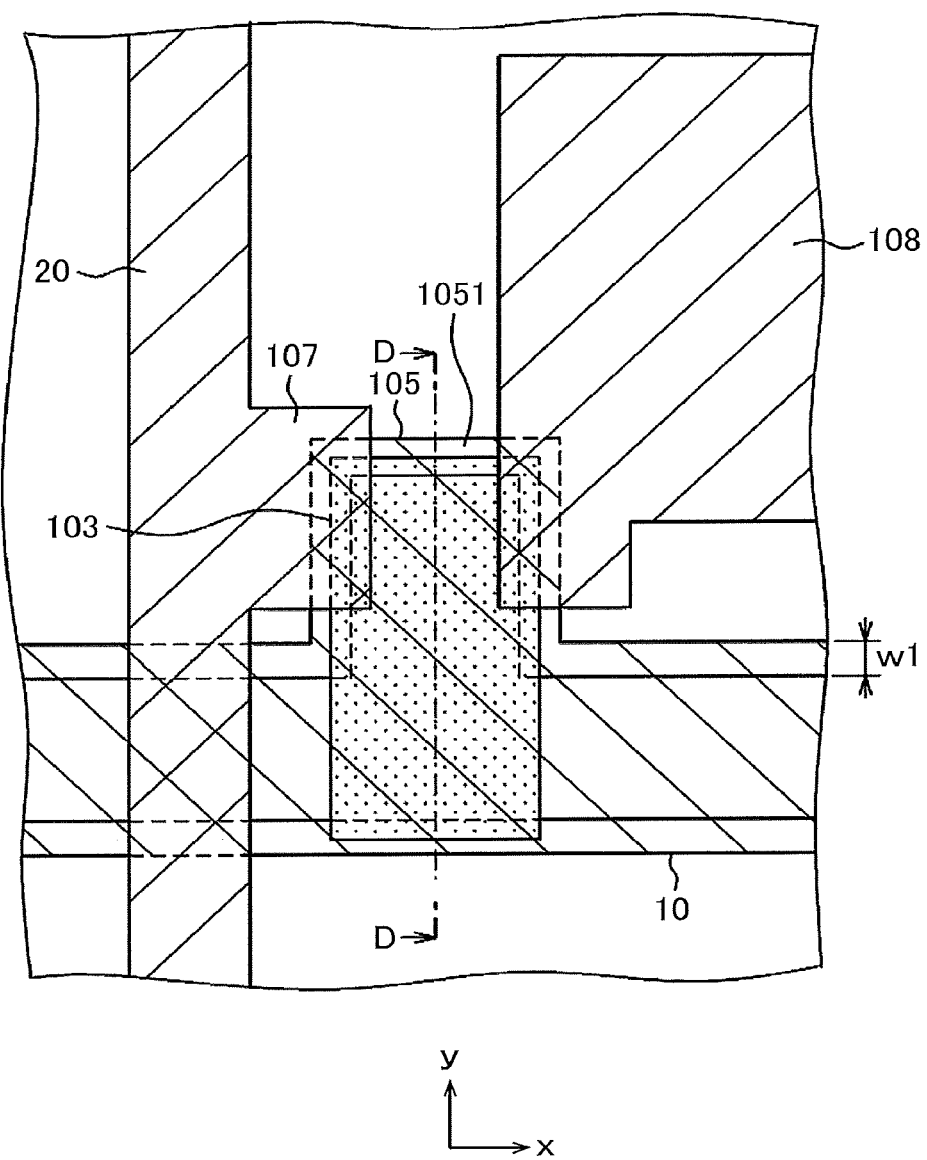
FIG. 15 is a plan view of yet another example of the present invention.

FIG. 15 is a plan view of another example that the position of the TFT in the pixel is differentiated from that of FIG. 2. In FIG. 15, the video signal lines 20 extend in the longitudinal direction (y direction); the scanning lines 10 extend in the lateral direction (x direction). The TFT is formed near the cross point of the video signal line 20 and the scanning line 10.

In FIG. 15, the video signal line 20 has a branch to form the drain electrode 107; the scanning line 10 has a branch to form a gate electrode 105. The source electrode 108 is laminated on the semiconductor layer 103 as opposing to the drain electrode 107 in a plan view. The channel portion is formed between the drain electrode 107 and the source electrode 108. The semiconductor layer 103, which is formed island like, is formed on the gate electrode 105 and the scanning line 10 through the gate insulating film 104.

The feature of FIG. 15 is that the semiconductor layer 103, which is formed island like, lies over the gate electrode 105 and the scanning line 10; however, the region that contributes to the ON current of the TFT, namely, the channel portion is the place where the drain electrode 107 and the source electrode 108 oppose to each other. The purpose of the structure of FIG. 15 is to eliminate the overlap between the drain electrode 107 and the scanning line 10, and the overlap between the source electrode 108 and the scanning line 10; thus, to minimize the unnecessary floating capacitance. On the other hand, the reason why the semiconductor layer 103 is extended to near the edge of the scanning line, where the drain electrode 107 and the source electrode 108 do not exist, is to set the edge of the semiconductor layer 103 at the tapered portion 1051 at the edge of the scanning line 10.

In FIG. 15, a taper 1051 is formed in a width of w1 at the gate electrode 105 and the scanning line 10; the edge of the semiconductor layer 103 is set on the tapered portion 1051 of the gate electrode 105. Therefore, a taper is formed at the surface of the semiconductor layer 103 in a same angle of the taper 1051 of the gate electrode 105 near the upper edge and lower edge (in the y direction) of the semiconductor layer 103 in FIG. 15. In other words, the cross sectional view of FIG. 15 along the line D-D is also the same as FIGS. 9 and 10. Thus, the inflection point Q of the ON current of the TFT is eliminated or the influence of the inflection point Q is decreased, and the step disconnection of the insulating film formed on the semiconductor layer 103 can be avoided. As described above, even the position and the like of the TFTs are different, the present invention can be applied.

Embodiment 2

Figure 16:
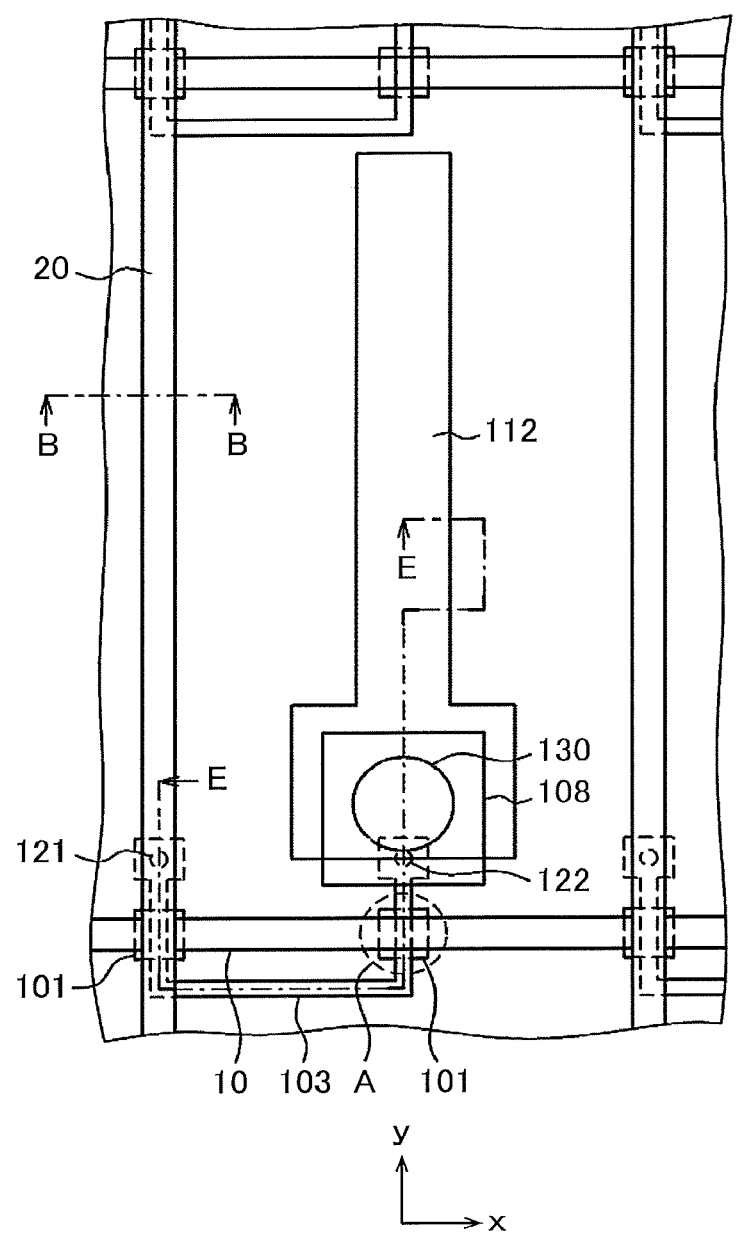
FIG. 16 is a plan view of the pixel in the display area of the liquid crystal display device according to the embodiment 2.

In the embodiment 1, it is explained that the present invention is applied to the bottom gate type TFT. The present invention can be applied to the top gate type TFT, too. FIG. 16 is a plan view of the pixel, in which the top gate type TFT is used. In FIG. 16, the scanning lines 10 extend in the lateral direction (x direction); the video signal lines 20 extend in the longitudinal direction (y direction). The pixel electrode 112 is formed in the area surrounded by the scanning lines 10 and the video signal lines 20. In FIG. 16, the video signal line 20 and the semiconductor layer 103 is connected via through hole 121; the semiconductor layer 103 goes through under the scanning line 10 twice, and connects with the pixel electrode 112 via through hole 122 and the through hole 130.

The semiconductor layer 103 extends in U-shaped; the semiconductor layer 103 is given conductivity by ion implantation except the place under the scanning line 10. In FIG. 16, the regions of the semiconductor that the conductivity is given become either the drain region or the source region. In FIG. 16, the scanning line 10 works as the gate electrode 105, the two portions where the semiconductor layer 103 goes through under the scanning line 10 are channel regions of the TFT, namely, the TFT in FIG. 16 is a double gate TFT. In such a structure, the semiconductor layer is formed by poly silicon in many cases.

In FIG. 16, the light shielding film 101 is formed by a metal or an alloy under the gate electrode 105 (the scanning line 10) and the semiconductor layer 103. Since the liquid crystal is not self-illuminant, back light is illuminated from the back of the TFT substrate 100; the transmittance of the back light is controlled in each of the pixels, thus, images are formed. However, if the back light is illuminated to the semiconductor layer 103 of the channel portion, a photo current is generated, which is to be a leak of the TFT. The light shielding film 101 is formed to stop the back light to prevent the photo current. Other structures of FIG. 16 are the same as explained in FIG. 2.

Figure 17:
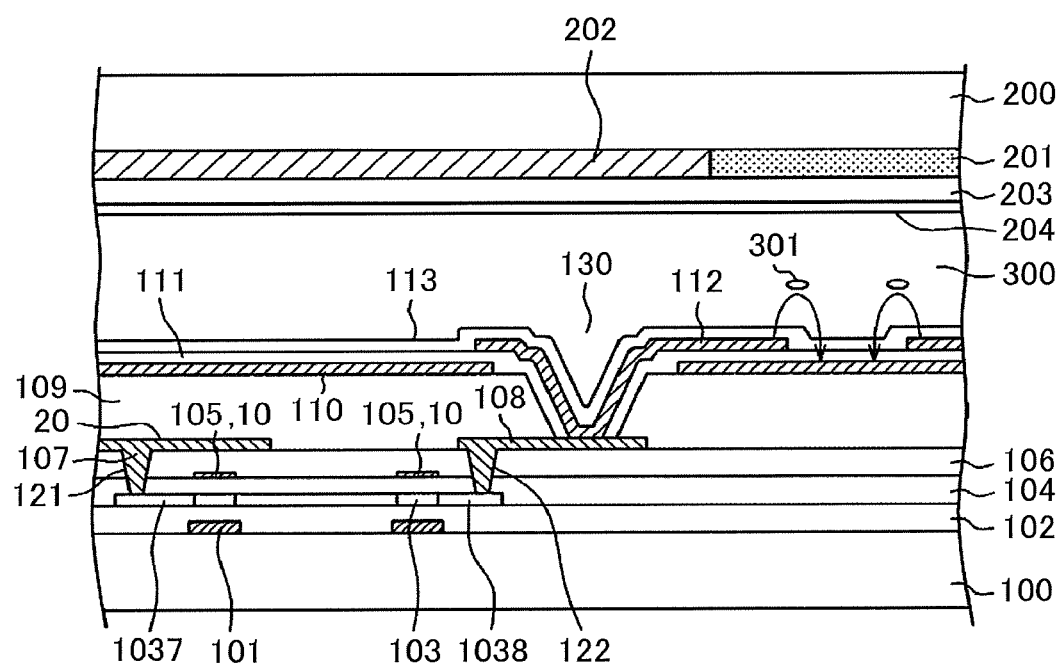
FIG. 17 is a cross sectional view of FIG. 16 along the line E-E.

FIG. 17 is a cross sectional view of FIG. 16 along the line E-E. In FIG. 17, the light shielding film 101 is formed by metal on the TFT substrate 100. In many cases, light shielding film 101 is formed by the same material as the scanning line 10 or the gate electrode 105. The light shielding film 101 is formed to cover the channel portion of the semiconductor layer 103 from the bottom to shield the channel portion from the back light.

The undercoat 102 is formed covering the light shielding film 101. The undercoat 102 is generally a laminated film of the SiO film and the SiN film. The role of the undercoat 102 is to prevent the semiconductor layer 103 from being contaminated by impurities from the TFT substrate 100 of glass and the like.

The semiconductor layer 103 for the TFT is formed on the undercoat 102. The semiconductor layer 103 connects with the video signal line 20 at the through hole 121, and connects with the source electrode 107 at the through hole 122. The gate insulating film 104, which is formed by SiO using the TEOS (Tetraethyl orthosilicate) as the material, is formed to cover the semiconductor layer 103. The gate electrode 105 is formed on the gate insulating film 104; the scanning line 10 works as the gate electrode 105.

After the gate electrode 105 is formed, P (Phosphor) or B (Boron) or the like are doped in the semiconductor layer 103 to give conductance by ion implantation except the place under the gate electrode 105; consequently, the drain region 1037 and the source region 1038 are formed in the semiconductor layer 103. After that the interlayer insulating film 106 is formed to cover the gate electrode 105. After that, the through hole 121 is formed in the interlayer insulating film 106 and the gate insulating film 104 to connect the video signal line 20 and the semiconductor layer 103; and the through hole 122 is formed in the interlayer insulating film 106 and the gate insulating film 104 to connect the source electrode 108 and the semiconductor layer 103.

After that the organic passivation film 109 is formed to cover the drain electrode 107 and the source electrode 108. Since the organic passivation film 109 has a role as a flattening film, too, it is formed as thick as 2 to 4 μm. The structures over the organic passivation film 109 is the same as FIG. 3, therefore, the explanation is omitted.

Figure 18:
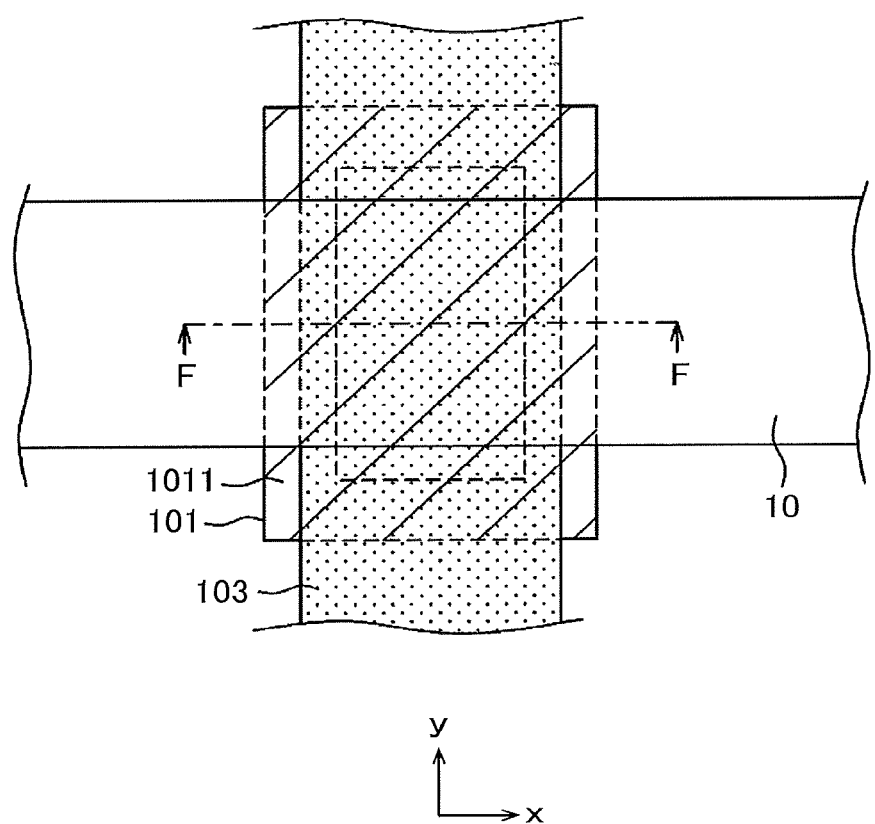
FIG. 18 is an enlarged plan view of the area of A in FIG. 16.

FIG. 18 is a detailed plan view of the area A in FIG. 16, the region where the semiconductor layer 103 and the scanning line 10 intersect; namely, the plan view of the region that the TFT is formed. In FIG. 18, the scanning line 10 extends in the lateral direction (x direction); the semiconductor layer 103 extends in the longitudinal direction (y direction). The gate insulating film 104 is formed between the scanning line 10 and the semiconductor layer 103. The channel portion of the TFT is formed in the region where the scanning line 10 and the semiconductor layer 103 overlap; the drain region and the source region of the TFT are formed in the region of the semiconductor layer 103 where the scanning line 10 and the semiconductor layer 103 do not overlap, in which P (Phosphor) or B (Boron) and the like are implanted by ion implantation.

The light shielding film 101 made of metal is formed under the channel portion of the semiconductor layer 103 through the undercoat 102 formed by SiO or SiN. The light shielding film 101 is formed by e.g. the same metal as the scanning line 10. In FIG. 18, the light shielding film 101 is formed island like, and the edge of it has a tapering. The edge of the semiconductor layer 103 in the x direction is patterned so that the edge is on the tapered portion of the light shielding film 101.

Figure 19:
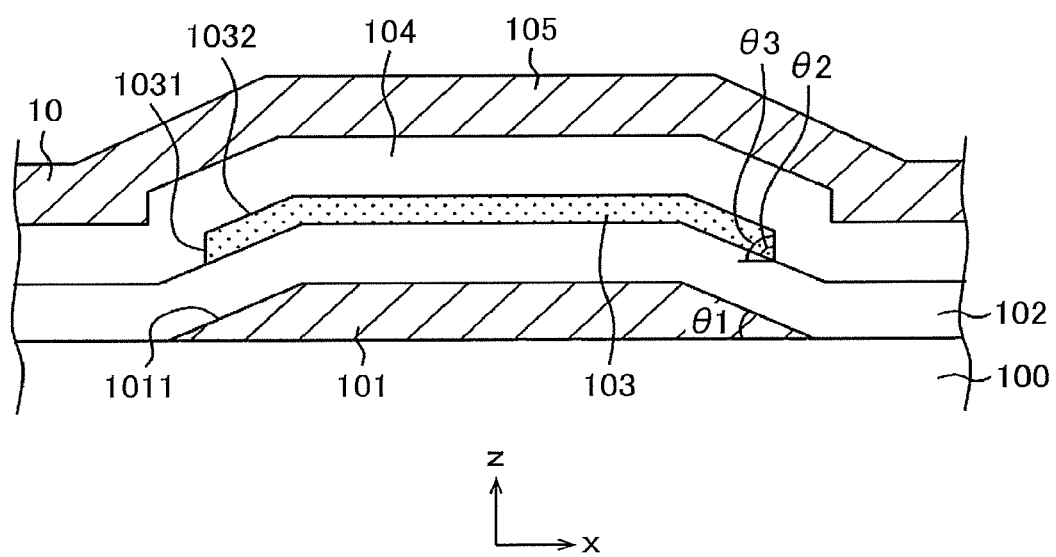
FIG. 19 is a cross sectional view of FIG. 18 along the line F-F.

FIG. 19 is a cross sectional view of FIG. 18 along the line F-F. In FIG. 19, the light shielding film 101 is formed on the TFT substrate 100, which is made of e.g. glass. The edge of the light shielding film 101 has a sloping surface 1011 having a taper angle of $\theta1$. The undercoat 102 is formed to cover the light shielding film 101. In many cases the under coat 102 is a laminated film of the SiO film and SiN film; however, the undercoat 102 in FIG. 19 is one layer for simplification of the drawing.

The semiconductor layer 103 is formed on the undercoat 102. The edge of the semiconductor layer 103 is set on the slope portion 1011 of the light shielding film 101. Therefore, surfaces at the both sides of the semiconductor layer 103 have a taper 1032 along the sloping surface 1011 of the light shielding film 101 in a taper angle of $\theta1$. The semiconductor layer 103 is etched to have a taper angle of $\theta2$ with respect to the undercoat 102. The taper angle of $\theta2$ is set so that the gate insulating film 104, which is formed on the semiconductor layer 103, does not get a step disconnection.

Consequently, as depicted in FIG. 19, the surface 1031 of the edge of the semiconductor layer 103 is to have a taper angle of $\theta3$ with respect to the horizontal direction, namely to the x axis direction. Therefore, as explained in the embodiment 1, it is possible to avoid the inflection point Q in Vg-Id characteristics of the TFT; or the influence can be decreased even the inflection point Q appears.

In FIG. 19, the gate insulating film 104 is formed to cover the semiconductor layer 103. The angle of the semiconductor layer 103 relating to the step coverage of the gate insulating film 104 is a taper angle $\theta2$ of the edge of the semiconductor layer 103; the taper angle $\theta2$ is selected so that the gate insulating film 104 does not have a step disconnection. The scanning line 10 extends in the lateral direction (x direction) on the gate insulating film 104 in FIG. 19.

As described above, in the top gate type TFT, too, the problem of the inflection point Q in the TFT characteristics and the problem of the step coverage of the gate insulating film 104 with respect to the semiconductor layer 103 can be solved simultaneously by utilizing the taper angle $\theta1$, which is formed in the light shielding film 101 under the semiconductor layer 103.

Embodiment 3

Figure 20:
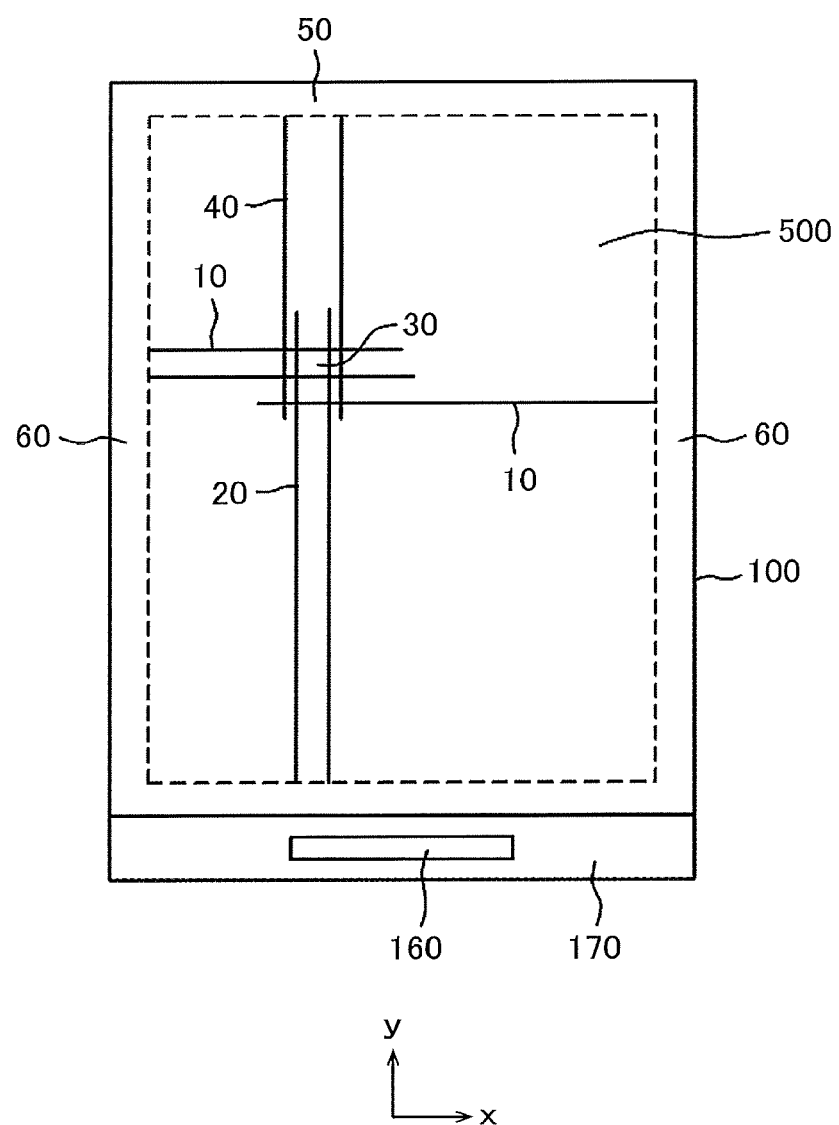
FIG. 20 is a plan view of the organic EL display device.

FIG. 20 is a plan view of the organic EL display device. In FIG. 20, in the display area 500, the video signal lines 20 extend in the longitudinal direction (y direction), and the power lines 40 extend from the upper side to the lower side in the display area 500. The power line 40 supplies current to the organic EL layer in each of the pixels. The scanning lines 10 extend in the lateral direction (x direction) in the display area 500. The scanning lines 10 extend alternately from the scanning line driving circuits 60, which are formed at both sides of the display area 500. The pixel is formed in the area surrounded by the video signal lines 20 and the scanning lines 10 or the area surrounded by the power lines 40 and the scanning lines 10.

The scanning line driving circuits 60 are formed at the both sides of the display area 500; the contact hole group 50 to supply current to the power lines is formed at the upper area in y direction of the display area 500. In FIG. 20, the video signals are supplied to the video signal lines 20 from the driver IC 160 installed on the terminal area 170.

In the organic EL display device in FIG. 20, the TFT for switching and the TFT for driving the organic EL layer are formed in each of the pixels 30. The cross sectional structure of the display area 500 is the same as the liquid crystal display device up to the organic passivation film as explained in FIG. 3 and FIG. 17. The main difference between the organic EL display device and the liquid crystal display device is in a structure above the organic passivation film 109 in FIG. 3 and FIG. 17. In the organic EL display device, the anode, the organic EL layer, the cathode and the like are formed instead the pixel electrode, the common electrode, the liquid crystal layer and the like in the liquid crystal display device. Therefore, since the structures of the TFTs explained in the embodiments 1 and 2 are the same in the organic EL display device, the present invention is applicable to the organic EL display device.

In the above explanations, the cross sectional structures in the display area in the liquid crystal display device and the organic EL display device are explained; however, the present invention is applicable to the TFTs in the driving circuits.

In the above explanations, the TFT was explained to have the semiconductor layer of the a-Si or poly-Si; however, the present invention is applicable to the TFT that has the oxide semiconductor layer.

Further, in the above explanations, the present invention was explained in the liquid crystal display device and the organic EL display device; however, the present invention is applicable to other flat display devices that use TFTs as e.g. the display device that uses electrophoresis.

What is claimed is:

1. A display device including a TFT substrate having a thin film transistor (TFT) comprising:
   a semiconductor layer having a channel between a drain electrode and a source electrode; and
   a gate insulating film formed on a gate electrode, the semiconductor layer formed on the gate insulating film,
   wherein a channel length direction is defined by a direction from the drain electrode to the source electrode, and a channel width direction is defined by a direction perpendicular to the channel length direction,
   wherein the gate electrode, near its edge, has a first slope surface having a first taper angle in a cross sectional view along the channel width direction, and
   wherein an edge of the semiconductor layer in the cross sectional view along the channel width direction lies on the first slope surface of the gate electrode and lies on and directly above a slope surface of the gate insulating film.

2. The display device according to claim 1, wherein the first taper angle is 10 degrees to 60 degrees.

3. The display device according to claim 1, wherein the first taper angle is 15 degrees to 40 degrees.

4. The display device according to claim 1, wherein, in a cross sectional view along the channel width direction, the semiconductor layer has a second slope surface having a first angle above the first slope surface of the gate electrode, and a third slope surface, being outside of the second slope surface, having a second angle with respect to the first slope surface.

5. The display device according to claim 4, wherein the second angle is bigger than the first angle.

6. The display device according to claim 4, wherein an angle of the third slope surface with respect to a horizontal surface of the TFT substrate is a third angle, which is a summation of the first angle and the second angle.

7. The display device according to claim 6, wherein the third angle is 90 degrees.

8. The display device according to claim 1, wherein the TFT is formed in a display area.

9. The display device according to claim 1, wherein the display device is a liquid crystal display device.

10. The display device according to claim 1, wherein the display device is an organic EL display device.

* * * * *